United States Patent
Pascucci et al.

[11] Patent Number: 5,515,332
[45] Date of Patent: May 7, 1996

[54] METHOD AND CIRCUIT FOR TIMING THE LOADING OF NONVOLATILE-MEMORY OUTPUT DATA

[75] Inventors: Luigi Pascucci, Sesto San Giovanni; Marco Maccarrone, Palestro; Marco Olivo, Bergamo, all of Italy

[73] Assignee: SGS–Thomson Microelectronics, S.r.l., Milan, Italy

[21] Appl. No.: 391,160

[22] Filed: Feb. 21, 1995

[30] Foreign Application Priority Data

Feb. 18, 1994 [EP] European Pat. Off. ............... 94830069

[51] Int. Cl.⁶ ..................................................... G11C 7/02
[52] U.S. Cl. ..................... 365/233; 365/189.05; 365/194; 365/206; 365/208
[58] Field of Search ................................ 365/233, 233.5, 365/189.05, 189.08, 191, 201, 206, 208, 194

[56] References Cited

U.S. PATENT DOCUMENTS

| | | | |
|---|---|---|---|
| 4,335,525 | 6/1982 | Akatsuka | 365/233 |
| 5,056,064 | 10/1991 | Iwahashi et al. | 365/189.05 |
| 5,057,711 | 10/1991 | Lee et al. | 365/189.05 |
| 5,200,926 | 4/1993 | Iwahashi et al. | 365/189.05 |

FOREIGN PATENT DOCUMENTS

| | | | |
|---|---|---|---|
| 0017990 | 10/1980 | European Pat. Off. | G11C 8/00 |
| 0322901 | 7/1989 | European Pat. Off. | G11C 7/00 |
| 3108185 | 5/1991 | Japan | G11C 11/406 |

Primary Examiner—Tan T. Nguyen
Attorney, Agent, or Firm—David V. Carlson; Seed and Berry

[57] ABSTRACT

A load timing circuit including an output simulation circuit similar to the output circuits of the memory, so as to present the same propagation delay; a simulating signal source for generating a data simulating signal; a synchronizing network for detecting a predetermined switching edge of the data simulating signal and enabling supply of the signal to the output simulation circuit and data supply to the output circuits of the memory; a combinatorial network for detecting propagation of the data simulating signal to the output of the output simulation circuit and disabling the data simulating signal; and a reset element for resetting the timing circuit.

18 Claims, 6 Drawing Sheets

5,515,332

1

METHOD AND CIRCUIT FOR TIMING THE LOADING OF NONVOLATILE-MEMORY OUTPUT DATA

CROSS REFERENCE TO RELATED APPLICATIONS

The present application claims priority from European Patent Application No 94830069.4, filed Feb. 18, 1994, and incorporated herein by reference. The present application is related to pending U.S. patent application entitled "INTERNAL TIMING METHOD AND CIRCUIT FOR PROGRAMMABLE MEMORIES", by Luigi Pascucci, Marco Olivo and Carla Maria Golla and filed on No. 08/391,159 (Seed and Berry Docket No. 854063.420), which claims priority from European Patent Application No. 94830070.2, filed on Feb. 18, 1994; U.S. patent application entitled "LOAD SIGNAL GENERATING METHOD AND CIRCUIT FOR NONVOLATILE MEMORIES", by Luigi Pascucci and Carla Maria Golla, and filed on No. 08/391,146 (Seed and Berry Docket No. 854063.421), which claims priority from European Patent Application No. 94830071.0, filed on Feb. 18, 1994; U.S. patent application entitled "PROGRAMMABLE LOGIC ARRAY STRUCTURE FOR SEMI CONDUCTOR NONVOLATILE MEMORIES, PARTICULARLY FLASH-EEPROMS", by Silvia Padoan and Luigi Pascucci, and filed on No. 08/391,149 (Seed and Berry Docket No. 854063.422), which claims priority from European Patent Application No. 94830072.8, filed on Feb. 18, 1994; U.S. patent application entitled "METHOD AND CIRCUIT FOR SUPPRESSING DATA LOADING NOISE IN NONVOLATILE MEMORIES", by Luigi Pascucci, Carla Maria Golla and Marco Maccarrone, and filed on No. 08/391,147 (Seed and Berry Docket No. 854063.423), which claims priority from European Patent Application No. 94830073.6, filed on Feb. 18, 1994; U.S. patent application entitled "METHOD AND CIRCUIT FOR TIMING THE READING OF NONVOLATILE MEMORIES", by Luigi Pascucci, Silvia Padoan, Carla Maria Golla, Marco Maccarrone and Marco Olivo, and filed on No. 08/391,920 (Seed and Berry Docket No. 854063.424), which claims priority from European Patent Application No. 94830074.4, filed on Feb. 18, 1994, all of which are incorporated herein by reference.

TECHNICAL FIELD

The present invention relates to a method and circuit for timing the loading of nonvolatile-memory output data.

BACKGROUND OF THE INVENTION

As is known, when reading a memory, the content (data) of the read memory cells is transferred to output buffers by which the internal data is transferred externally; and the buffers comprise drivers' for loading the data into the respective buffer at the right time.

In known memories, under certain conditions and at certain internal nodes of the device, switching of the output buffers may result in noise affecting the output data from the memory as a result of bouncing (repeat switching) at the outputs. To prevent such noise, the drivers of the output buffers must therefore be isolated from the internal memory circuits as soon as the data is loaded, to prevent bouncing or at least minimize it as far as possible. Such isolation, however, involves precise timing for ensuring effective noise suppression on the one hand, and, on the other, correct data transfer from the memory cells to the output buffers.

SUMMARY OF THE INVENTION

It is an object of the present invention to provide a system for timing the transfer of data from the memory to the output buffers, and which provides for reliable noise suppression while at the same time ensuring correctly timed transfer of the output data from the memory.

In practice, according to the present invention, a latch type output simulation circuit similar to the output circuits of the memory is employed; the output simulation circuit is supplied with a data simulating signal; loading of the data simulating signal in the output simulation circuit is enabled substantially simultaneously with data loading by the output circuits; and upon the data simulating signal reaching the output simulation circuit output, loading is disabled and the timing circuit reset.

The timing achievable in this way is accurately synchronized with transmission of the signal, and supplies a signal of such short duration as to reduce the effects of noise induced by switching of the buffers. In practice, it provides for a timing circuit which is substantially unaffected by noise.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
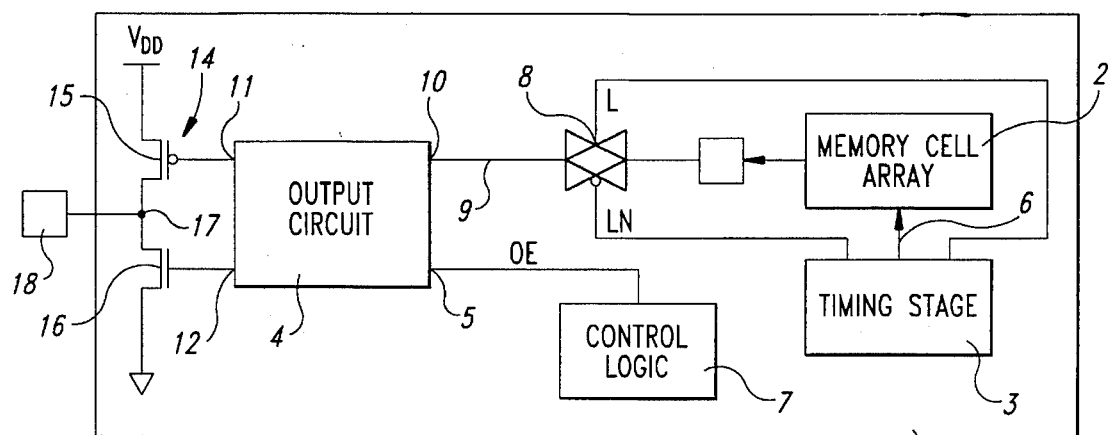
FIG. 1 shows a highly simplified diagram of a known memory array.

FIG. 1 shows a schematic diagram of a nonvolatile memory 1 of which are shown only a memory cell array 2 (also including the sense amplifiers) in which data is stored; a timing stage 3 for generating all the timing signals for operation of the memory; one of the output circuits 4 provided in any known manner with latch elements, and comprising drivers and output buffers (not shown); and a control logic circuit 7.

Figure 2:
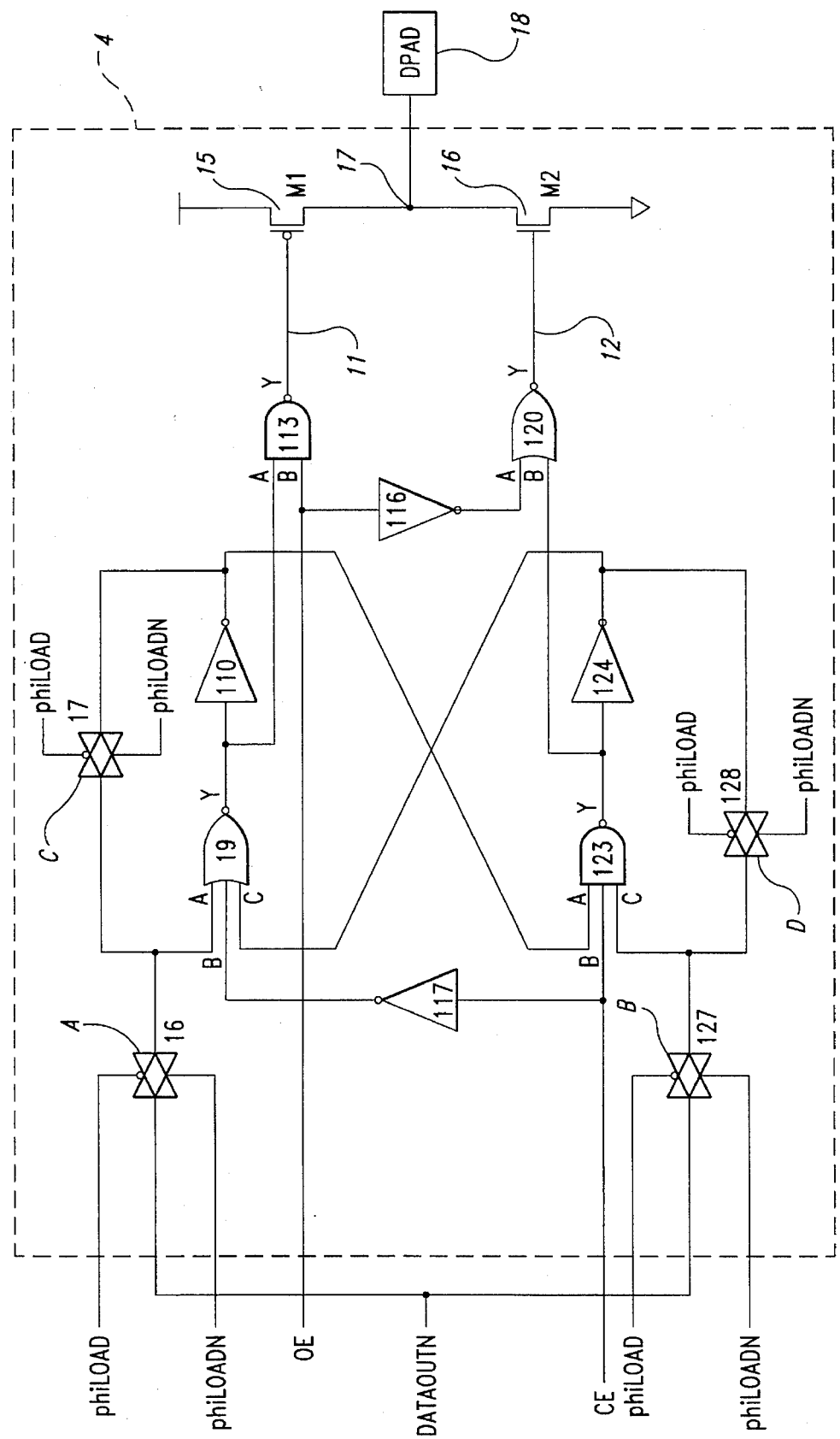
FIG. 2 shows a circuit diagram of one embodiment of the output circuit of FIG. 1.

FIG. 2 is a circuit diagram of one embodiment of output circuit 4 of FIG. 1. In operation, gates I9 and I23, which form a latch circuit, are fed with signal DATAOUTN when switches A and B are closed, i.e., when signal phiLOAD is logic high, and signal phiLOADN is logic low. Switches C and D are open during the period when switches A and B are closed. Next, when signals phiLOAD and phiLOADN switch, i.e., phiLOAD becomes low and phiLOADN becomes logic high, the data input to gates I9 and I23 is transferred to output gates I13 and I20. Also, switches A and B open and switches C and D close. Enable signal OE enables the data transferred to gates I13 and I20 to be transferred to push/pull transistors 15 and 16 and thus to output pad 18 as discussed below regarding FIG. 1. Signal OE and another enable signal CE are generated in other parts of memory circuit 1 in order to disable output circuit 4 when the outputting of data is not required. Signal phiLOAD is generated internally within memory 1 to synchronize output circuit 4 to the other circuits within memory 1. Signal phiLOADN is obtained by inverting signal phiLOAD.

In operation, control logic 7 generates an enabling signal OE, which is supplied to input 5 of output circuit 4, and timing stage 3 generates enabling signals (not shown) that are supplied to array 2 over line 6, and a pair of load signals L, LN, inverted in relation to each other, which are supplied to the control terminals of a controlled switch 8. Switch 8 is disposed along an output data line 9 connecting array 2 to a second input 10 of output circuit 4. Output circuit 4 presents a pair of outputs 11 and 12 connected to a push-pull unit comprising a pair of MOS transistors 15 and 16 of opposite types. More specifically, P-channel transistor 15 presents its source terminal connected to supply line $V_{DD}$, its gate terminal connected to output 11 of output circuit 4, and its drain terminal connected to the drain terminal of N-channel transistor 16. Transistor 16 presents its gate terminal connected to output 12 of output circuit 4, and a grounded source terminal. Node 17 between the two drain terminals of transistors 15 and 16 is connected to the output terminal 18 of memory 1.

To prevent noise arising and being transmitted back from output circuit 4 to array 2, which noise could result in overwriting of the data supplied by the memory array and hence in further (erroneous) switching of the output circuit, generation of signals L and LN by timing stage 3 must be accurately timed to ensure immediate transmission of the data from array 2 to output circuit 4, and to interrupt data line 9 as soon as the data is loaded into output circuit 4. In this way, the buffers of output circuits 4 are isolated and any noise generated by them is prevented from being transmitted back.

Figure 3:
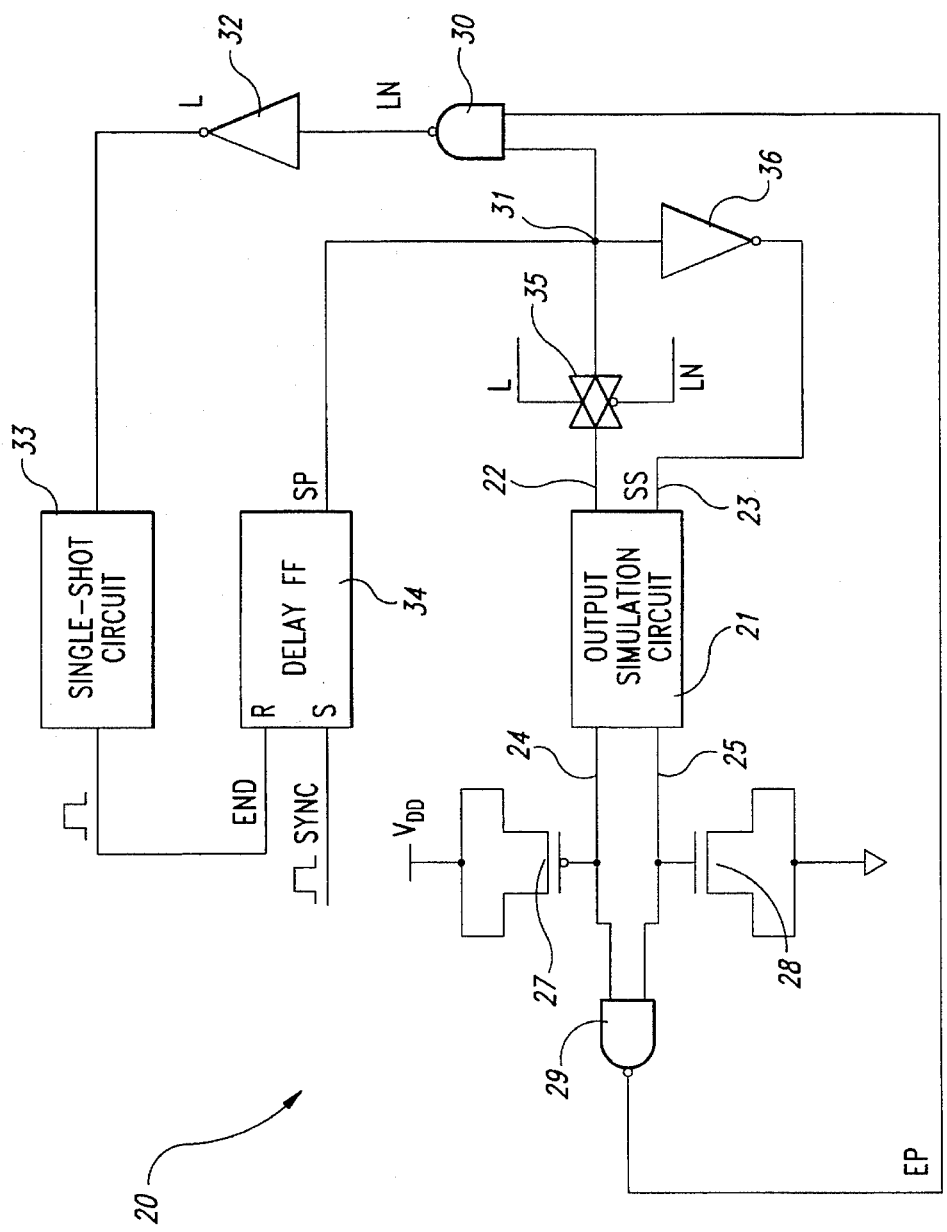
FIG. 3 shows a block diagram of the circuit according to the present invention.

For this purpose, timing stage 3 comprises an output data load timing circuit which, according to one aspect of the present invention, is as shown in FIG. 3.

With reference to FIG. 3, the timing circuit, indicated by 20, comprises an output simulation circuit 21, which, like output circuit 4 of memory 1 in FIG. 1, presents two inputs 22 and 23, two outputs 24 and 25, and an otherwise similar structure as output circuit 4 so as to accurately reproduce the same propagation delay as output circuit 4. Output 24 is connected to the gate terminal of a P-channel MOS transistor 27, the drain and source terminals of which are short-circuited and connected to supply line $V_{DD}$; while output 25 is connected to the gate terminal of an N-channel MOS transistor 28, the drain and source terminals of which are short-circuited and grounded. Transistors 27 and 28 thus act as capacitive elements for simulating the gate capacitances of transistors 15 and 16 of array 1 in FIG. 1, and ensuring similar geometry and circuit characteristics at the outputs of output circuit 4 and the output simulation circuit 21.

Outputs 24 and 25 are also connected to the inputs of a first NAND circuit 29, the output of which is connected to one input of a second NAND circuit 30 having a second input connected to a node 31. The output of NAND circuit 30 (generating signal LN) is connected to an inverter 32 which generates output signal L, which is inverted with respect to LN. Signals L and LN are the same as the load signals L and LN supplied to switch 8 in FIG. 1.

The output of inverter 32 is connected to the input of a single-shot (monostable) circuit 33 enabled by the trailing edge of load enabling signal L. The output of single-shot circuit 33, which generates a pulse signal END, is connected to the reset input R of a synchronizing and delay block 34 substantially formed by an asymmetrical delay flip-flop. Delay block 34 presents a second set input S supplied with a synchronizing signal SYNC generated by other sections (not shown) of timing circuit 3 and which enables data loading into the output buffers.

The output of block 34 (supplying data simulating signal SP) is connected to node 31 and via controlled switch 35 to input 22 of output simulation circuit 21, and via inverter 36 to input 23 of output simulation circuit 21. Like switch 8 in FIG. 1, the control terminals of controlled switch 35 are supplied with load signals L and LN generated by inverter 32 and NAND circuit 30, so that, as regards inputs and outputs (and internal structure, as already stated), output simulation circuit 21 operates in substantially or exactly the same way as output circuit 4 in FIG. 1, particularly as regarding the propagation delays between inputs 22 and 23 and outputs 24 and 25. The controlled switch 8 is typically similar or identical to the controlled switch 35.

Figure 4:
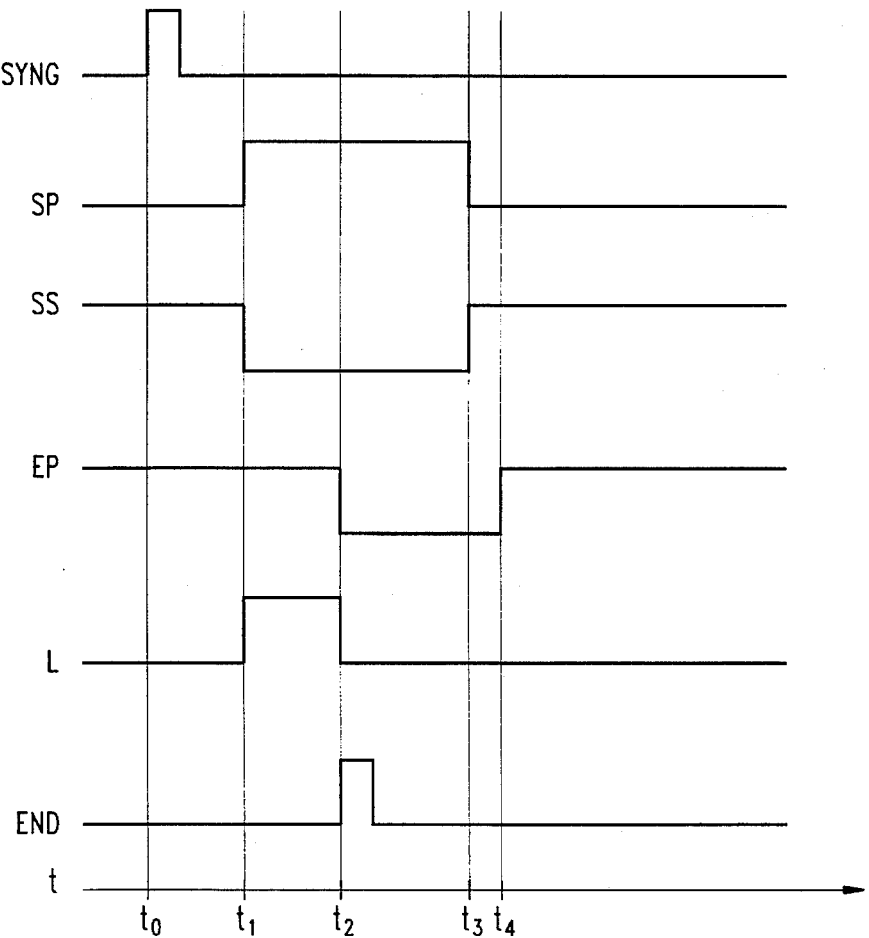
FIG. 4 shows a graph of a number of signals in the FIG. 2 diagram.

Operation of timing circuit 20 in FIG. 3 will now be described with reference also to FIG. 4 which, excluding the delays caused by switching of logic circuits 29, 30, and 32 and single-shot circuit 33, shows only the far more considerable propagation delays of output simulation circuit 21 and block 34.

To begin with, in the reset state, signals SYNC, SP, L and END are low; signals SS and EP are high; outputs 24 and 25 of output simulation circuit 21 are low; and switch 35 is open.

At time $t_0$, block 34 receives the SYNC signal pulse. With a given delay determined at the design stage or depending on the operations of array 1, output signal SP of block 34 switches high (time $t_1$) so that signal SS switches to low; NAND circuit 30 is supplied with a logic "1" at both inputs so that signal LN switches to low; inverter 32 switches so that output signal L switches to high; and switch 35 closes to supply data simulating signal SP to input 22. At substantially the same time, switch 8 in FIG. 1—which, as stated, is controlled by the same load enabling signals L and LN as is output simulation circuit 21—also closes, so that signal SP is transmitted to output simulation circuit 21 in the same way and substantially simultaneously with the data to output circuits 4 in FIG. 1.

Upon signal SP reaching output simulation circuit 21, bearing in mind also the delay caused by the capacitance of transistors 27 and 28 (and upon the data supplied by array 2 to input 10 reaching output circuit 4, bearing in mind the capacitance at the gate terminals of transistors 15 and 16), outputs 24 and 25 of output simulation circuit 21 switch to a logic high, thus switching NAND circuit 29 (time $t_2$); signal EP switches to low, thus successively switching NAND circuit 30 and inverter 32; and signal LN switches back to logic high, and signal L to logic low, thus opening switch 8 (FIG. 1) and switch 35 to terminate the data loading phase which thus lasts substantially exactly long enough for the data to be transmitted to output terminals 11 and 12 of output circuit 4.

On receiving the trailing edge of signal L, single-shot circuit 33 generates an output pulse (END signal) to reset block 34; after a given delay, signal SP switches back to logic low at time $t_3$, thus switching signal SS to logic high and resetting output simulation circuit 21, which, after a given delay, switches outputs 24 and 25 to logic low (time $t_4$); and circuit 29 switches so that its output signal EP switches to logic high to restore the start conditions.

The advantages of the circuit described are as follows. Firstly, it provides for generating a load enabling signal of minimum duration, but nevertheless capable of ensuring signal transmission to the output circuits 4. As a result, the output circuits 4 are connected to the memory array only long enough to ensure correct data transmission (and storage in the output circuits 4), and are disconnected immediately after loading to prevent (or at least minimize) harmful reflections due to the noise produced by switching of the output circuits 4. The load enabling signal is also synchronized with switching of the outputs to avoid phase differences preventing the data from being loaded into the output circuits.

Secondly, by virtue of the circuit being substantially or totally immune to noise, it is possible to increase the size of the final push-pull transistors and so improve dynamic transitional performance in high fan-out applications involving high capacitive loads.

Additionally, the timing circuit described is also extremely simple, provides for a high degree of reliability, and is easily integratable.

Figure 5:
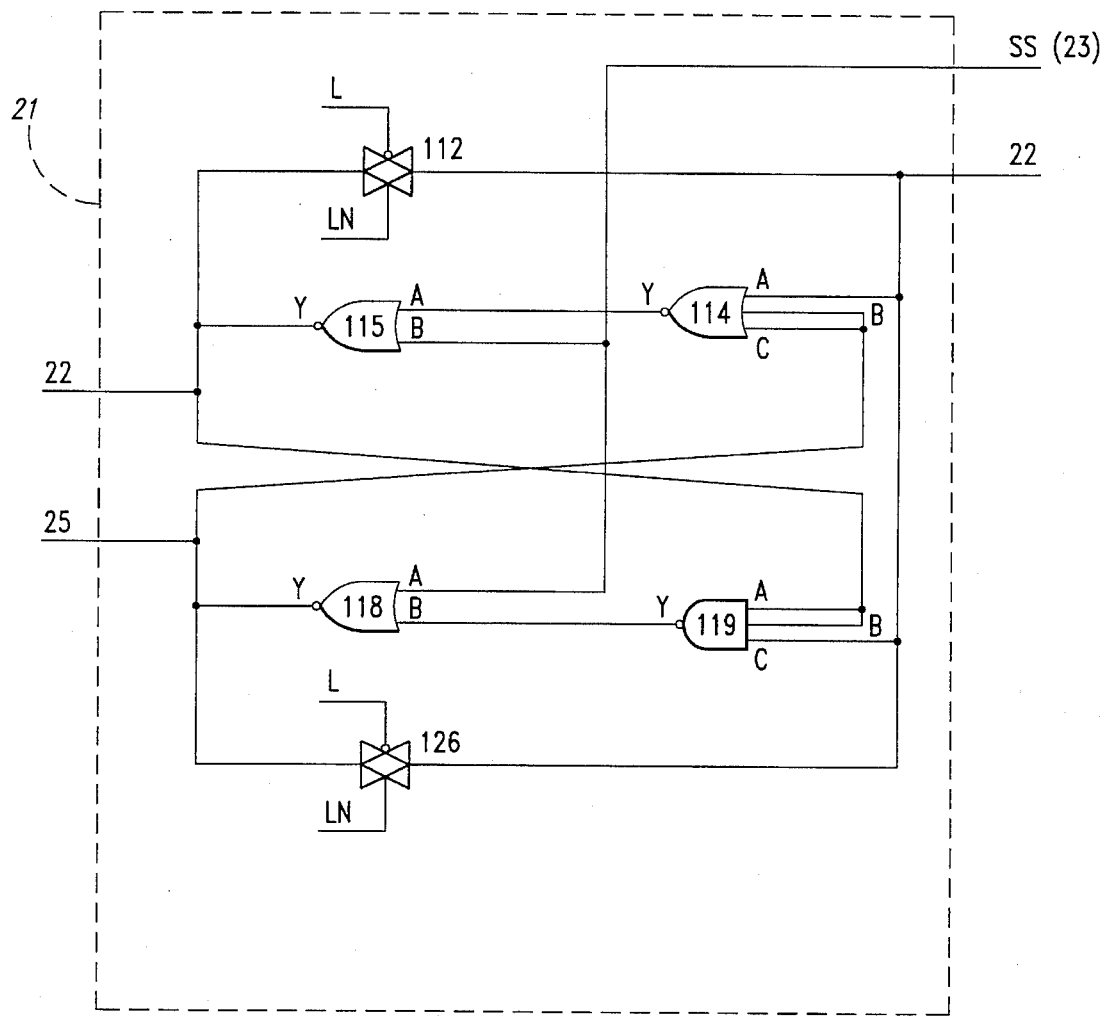
FIG. 5 shows a circuit diagram of one embodiment of the output simulation circuit of FIG. 3.

FIG. 5 is a circuit diagram of output simulation circuit 21 of FIG. 3 according to one aspect of the invention. Output simulation circuit 21 is constructed to provide the same or substantially the same delay as output circuit 4 of FIG. 1. In all aspects other than propagation delay, it is not necessary that output simulation circuit 21 be equivalent to output circuit 4. Typically, however, simulation circuit 21 includes the same number of gates having similar delay characteristics as an output circuit 4, along the signal propagation line (which is between DATAOUTN and outputs 11 and 12 of output circuit 4, and between input 22 and outputs 24 and 25 of output simulation circuit 21). In one aspect of the invention, the delays along the signal propagation lines for output circuit 4 and output simulation circuit 21 are both approximately 5 nanoseconds.

Figure 6:
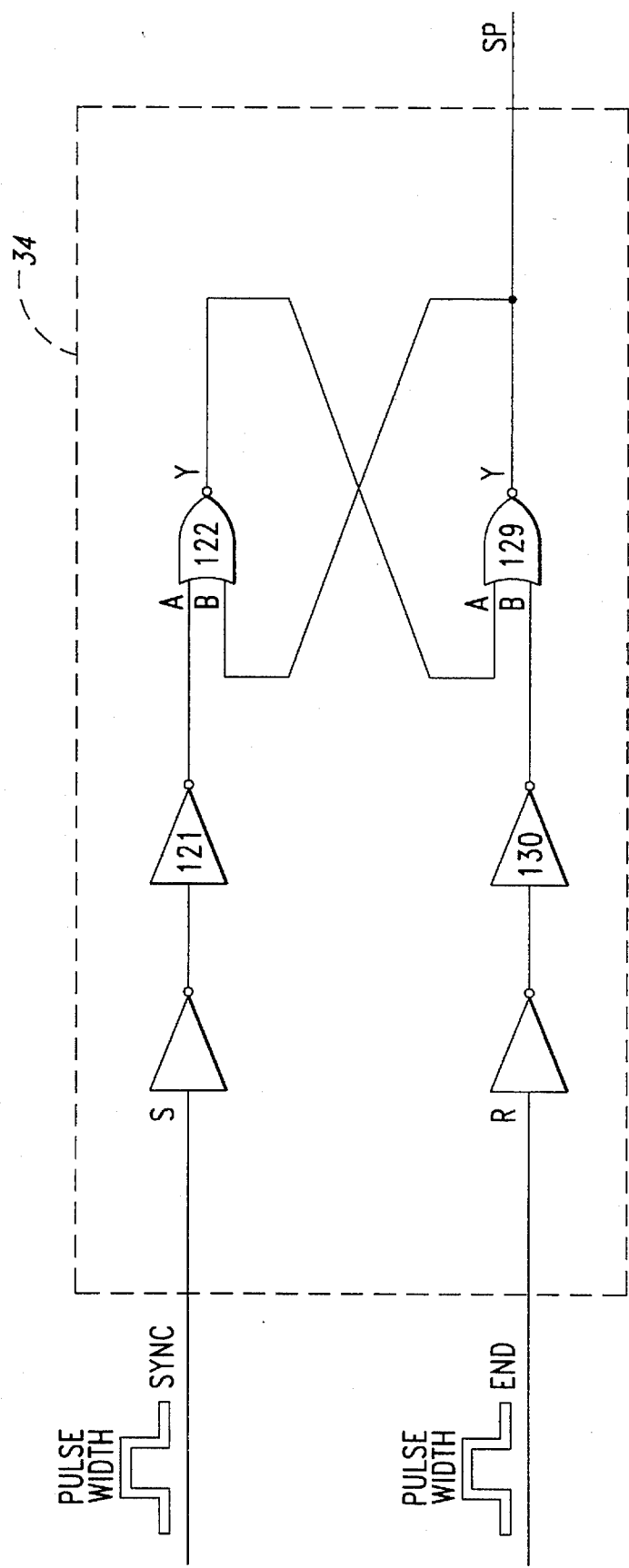
FIG. 6 is a circuit diagram of one embodiment of the delay flip-flop of FIG. 3.

FIG. 6 is a circuit diagram of delay flip-flop 34 of FIG. 3 according to one aspect of the invention. Flip-flop 34 includes at both its S and R inputs two serially coupled inverters that delay the input signals SYNCH and END, respectively. In operation, when both inputs are at a logic low, the output of gate I22 is logic high and the output of gate I29, which is signal SP, is logic low. When SYNCH switches to logic high, with a delay given by the time required for the leading edge of SYNCH to propagate through four gates (i.e., the two serially coupled inverters at the S input, and gates I22 and I29), SP switches to logic high. Thus, the input B of gate I22 switches to a logic high, and the switching of SYNCH back to logic low does not change the state of circuit 34. Signal END causes reset of the circuit 34, with signal SP switching back to logic low after a delay caused by the time required for the leading edge of END to propagate through three gates (the two serially coupled inverters at the R input and gate I29). In one aspect of the invention, the pulse widths for signals END and SYNCH are both approximately in the range of between 5 and 7 nanoseconds. Also, in another aspect of the invention, the set and reset delays of flip-flop 34 are both in the range of approximately 5 to 7 nanoseconds.

Figure 7:
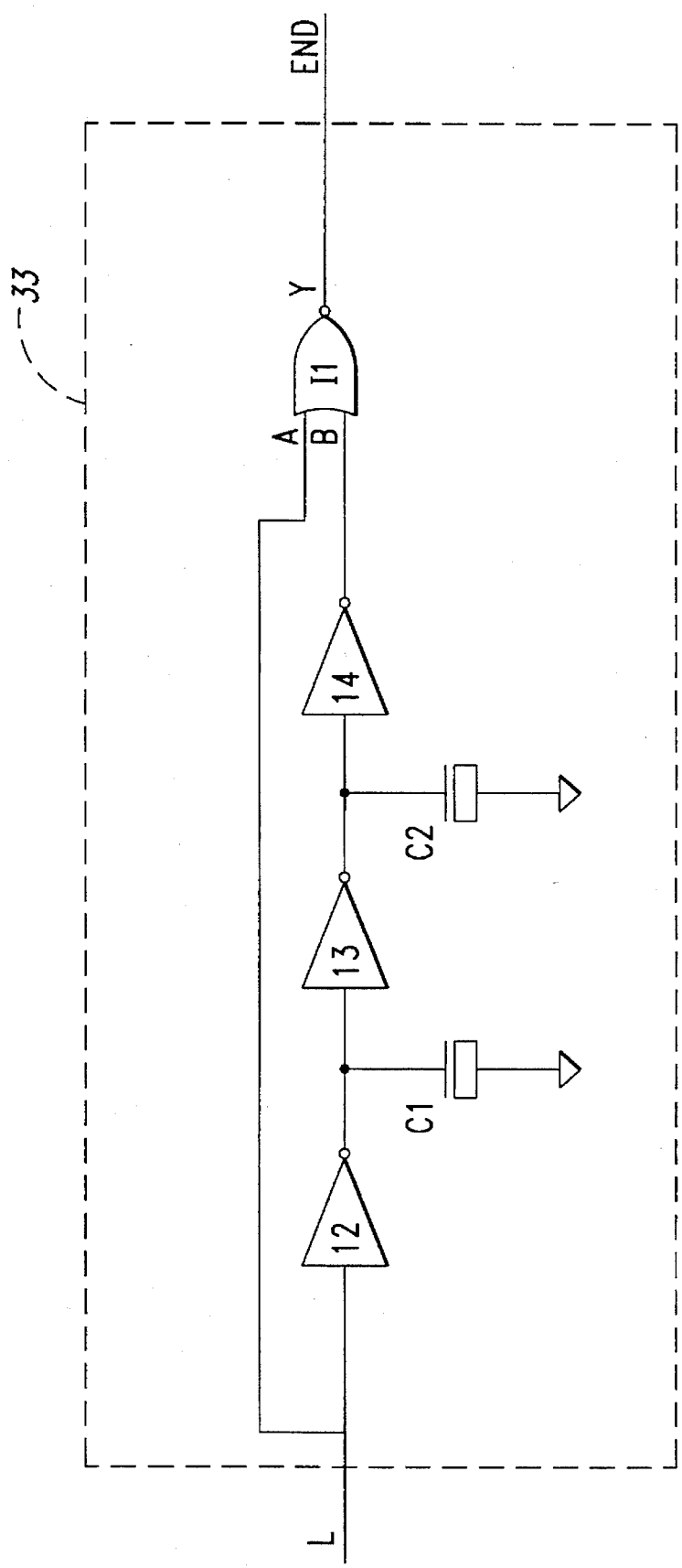
FIG. 7 is a circuit diagram showing one embodiment of the single shot circuit of FIG. 3.

FIG. 7 shows a circuit diagram of a propagation detection means which includes the single shot circuit 33 of FIG. 3 according to one aspect of the invention. Single shot circuit 33 includes three inverters and two capacitors arranged so as to form a delay line such that one input of NOR gate I1 switches later than the other input. For example, an initial condition may be when signal L is low, input B is logic high, and output signal END is logic low. When signal L switches to logic high, both inputs A and B are logic high, and signal END remains logic low. END also remains logic low even when input B switches to a logic low. When signal L switches to a logic low, both inputs A and B are then logic low, so END switches to a logic high and remains at a logic high until the falling edge of signal L has propagated along the delay line formed by the inverters and capacitors. Then, input B becomes logic high, and signal END transitions to a logic low.

Clearly, changes may be made to the timing circuit as described and illustrated herein without, however, departing from the spirit and the scope of the present invention.

We claim:

1. A method for timing the loading of nonvolatile memory output data, comprising the step of generating a data loading signal for loading data from an internal memory unit into at least one output circuit; characterized in that said step of generating a data loading signal comprises steps of:

generating a data simulating signal;

simultaneously enabling loading of data into said output circuit and loading of said data simulating signal into an output simulation circuit identical to said output circuit;

disabling loading of said data simulating signal and said data upon propagation of said data simulating signal to said output simulation circuit; and resetting said output simulation circuit.

2. A method as claimed in claim 1, characterized in that said enabling step comprises the step of generating a load enabling signal and simultaneously enabling a first line supplying said data to said output circuit, and a second line supplying said data simulating signal to said output simulation circuit.

3. A circuit for timing the loading of nonvolatile memory output data, comprising at least one output circuit; said timing circuit generating a load enabling signal; characterized in that it comprises an output simulation circuit identical to said output circuit; simulating signal generating means for generating a data simulating signal and output-connected to a first input of said output simulation circuit; simultaneous enabling means for simultaneously enabling said output simulation circuit and said output circuit; and propagation detecting means connected to the output of said output simulation circuit, for resetting said simulating signal generating means.

4. A circuit as claimed in claim 3, wherein said output circuit comprises at least one input with a first controlled switch; characterized in that said simultaneous enabling means comprises a second controlled switch interposed between said simulating signal generating means and said first input of said output simulation circuit; said first and second controlled switches comprising at least one control terminal supplied with said load enabling signal.

5. A circuit as claimed in claim 4, characterized in that said second controlled switch is identical to said first controlled switch.

6. A circuit as claimed in claim 3, characterized in that said simultaneous enabling means and said propagation detecting means comprise logic circuits connected to said simulating signal generating means and to said output simulation circuit, for enabling said load enabling signal on receiving said data simulating signal, and disabling said load enabling signal on detecting propagation of said data simulating signal to said output of said output simulation circuit.

7. A circuit as claimed in claim 6, characterized in that said logic circuits comprise a NAND circuit having an input connected to said simulating signal generating means and an input-connected to said output of said output simulation circuit, and which generates said load enabling signal.

8. A circuit as claimed in claim 6, characterized in that said propagation detecting means also comprises a single-shot circuit for detecting a predetermined switching edge of said load enabling signal and generating a pulse signal for resetting said simulating signal generating means.

9. A circuit as claimed in claim 3, characterized in that said simulating signal generating means comprises an input supplied with a synchronizing signal, for generating said data simulating signal on receiving said synchronizing signal.

10. A circuit as claimed in claim 3, wherein said output circuit of said nonvolatile memory presents two output terminals connected to respective capacitive elements; characterized in that said output simulation circuit comprises a first and second output terminal connected to a respective capacitive load of substantially the same value as said capacitive elements.

11. A circuit as claimed in claim 3, characterized in that said output simulation circuit comprises a second reset input connected to the output of said simulating signal generating means, for resetting said output simulation circuit upon detection of a predetermined switching edge of said data simulating signal.

12. A method for loading data from a memory unit of a memory circuit into an output circuit of said memory circuit, comprising:

generating a simulated data signal;

loading said data into said output circuit and loading said simulated data signal into an output simulation circuit substantially simultaneously, said output simulation circuit and said output circuit having similar delay characteristics; and ceasing said loading of said data in response to said simulated data signal propagating through said output simulation circuit.

13. The method of claim 12 further comprising;

generating an enable signal in response to said simulated data signal to enable said loading of said data and said simulated data signal respectively;

14. A circuit for controlling the loading of data into an output circuit of a memory device, comprising:

a data simulator operable to generate a simulated data signal;

an output simulator operable to receive said simulated data signal and having delay characteristics similar to those of said output circuit;

an enabler operable to generate an active level of an enable signal in response to said simulated data signal;

a switching circuit operable to substantially simultaneously couple said data to said output circuit and said simulated data signal to said output simulator in response to said active level; and a disabler operable to disable said enabler a predetermined time after said simulated data signal propagates through said output simulator.

15. The circuit of claim 14 further comprising a reset circuit operable to generate a pulse for resetting said data simulator in response to a predetermined transition edge of said enable signal.

16. The circuit of claim 14 wherein said data simulator is operable to generate said simulated data signal in response to a synchronizing signal.

17. The circuit of claim 14 wherein said output circuit has first and second output terminals coupled to first and second switching elements having first and second capacitances, further comprising;

said output simulator having third and fourth output terminals; and third and fourth elements coupled to said third and fourth terminals and having substantially said first and second capacitances.

18. The circuit of claim 14 wherein said output simulator is operable to be reset in response to a predetermined transition edge of said simulated data signal.

* * * * *